US008548496B2

(12) United States Patent
Tai

(10) Patent No.: US 8,548,496 B2
(45) Date of Patent: Oct. 1, 2013

(54) WIRELESS COMMUNICATION APPARATUS AND METHOD

(75) Inventor: Yu-Shu Tai, Taipei (TW)

(73) Assignee: Inventec Corporation, Taipei (TW)

( * ) Notice: Subject to any disclaimer, the term of this patent is extended or adjusted under 35 U.S.C. 154(b) by 109 days.

(21) Appl. No.: 13/294,193

(22) Filed: Nov. 11, 2011

(65) Prior Publication Data

US 2012/0322378 A1 Dec. 20, 2012

(30) Foreign Application Priority Data

Jun. 14, 2011 (CN) .......................... 2011 1 0165595

(51) Int. Cl.
*H04B 7/00* (2006.01)
*H04B 1/06* (2006.01)
*H03C 7/02* (2006.01)
*H04W 24/00* (2009.01)

(52) U.S. Cl.
USPC ....... 455/456.1; 455/41.2; 455/101; 455/272; 455/456.6

(58) Field of Classification Search
USPC ................. 455/41.2–41.3, 78, 82, 90.1–90.2, 455/455/101, 121, 129, 272, 275, 456.1, 455/456.6, 550.1, 575.1, 575.7
See application file for complete search history.

(56) References Cited

U.S. PATENT DOCUMENTS

| | | | | |
|---|---|---|---|---|
| 7,577,452 | B2 * | 8/2009 | Kimura et al. | 455/502 |
| 8,159,399 | B2 * | 4/2012 | Dorsey et al. | 343/702 |
| 2007/0222609 | A1 * | 9/2007 | Duron et al. | 340/572.7 |
| 2010/0285759 | A1 * | 11/2010 | Chung et al. | 455/101 |
| 2012/0052820 | A1 * | 3/2012 | Lin et al. | 455/90.2 |
| 2012/0071203 | A1 * | 3/2012 | Wong | 455/550.1 |

* cited by examiner

*Primary Examiner* — Simon Nguyen
(74) *Attorney, Agent, or Firm* — CKC & Partners Co., Ltd.

(57) ABSTRACT

A wireless communication apparatus includes a body, a first antenna, a second antenna, a sensor, a wireless transceiver, and a switch. Both of the first antenna and the second antenna are disposed in or on the body. The sensor is electrically connected to the first antenna and the second antenna for sensing whether an object is close to at least one of the first antenna and the second antenna to provide a sensing result. The wireless transceiver has a main antenna connection port. The switch is coupled to the wireless transceiver, the first antenna, and the second antenna for selecting one from the first antenna and the second antenna to be electrically connected to the main antenna connection port of the wireless transceiver according to the sensing result.

8 Claims, 6 Drawing Sheets

WIRELESS COMMUNICATION APPARATUS AND METHOD

RELATED APPLICATIONS

This application claims priority to China Application Serial Number 201110165595.2, filed Jun. 14, 2011, which is herein incorporated by reference.

BACKGROUND

1. Technical Field

The present disclosure relates to wireless communication apparatuses.

2. Description of Related Art

As technology advances, mobile phones are becoming increasingly popular. Although it is not clear if mobile phone electromagnetic radiation really affects human health, mobile phone users still seriously concern about the amount of mobile phone electromagnetic radiation. Even some consumers may thus change their purchase decisions.

Specific absorption rate (SAR) is a measure of the rate at which energy is absorbed by a body tissue when exposed to a radio frequency (RF) electromagnetic field produced by a mobile phone and has units of watts per kilogram (W/kg). SAR is usually averaged over a small sample volume (typically 10 g of tissue). International Commission on Non-Ionizing Radiation Protection (ICNIRP) recommends that the SAR limit for communication apparatuses is 2 W/kg. Federal Communications Commission (FCC) recommends that the SAR limit for communication apparatuses is 1.6 W/kg.

A usual way to reduce the SAR value of a communication apparatus is to sense whether a human body is close to the antenna of the communication apparatus by a sensor disposed near the antenna of the communication apparatus. The antenna power output of the communication apparatus is reduced when the human body is close to the antenna of the communication apparatus. Such an SAR reducing method has a number of difficulties:

(1) Manufacturers have to dispose the sensing electrode of the sensor near the antenna. The sensing electrode of the sensor may affect the efficiency of the antenna because the sensing electrode of the sensor is almost always made of a conductor.

(2) The antenna efficiency of the communication apparatus is inherently lower when the human body touches the antenna of the communication apparatus. Reducing the antenna power output of the communication apparatus makes the already poor communication quality poorer.

SUMMARY

One aspect of the present invention is to provide a wireless communication apparatus which presents a solution to the aforementioned difficulties.

According to one embodiment of the present invention, a wireless communication apparatus includes a body, a first antenna, a second antenna, a sensor, a wireless transceiver, and a switch. Both of the first antenna and the second antenna are disposed in or on the body. The sensor is electrically connected to the first antenna and the second antenna for sensing whether an object is close to at least one of the first antenna and the second antenna to provide a sensing result. The wireless transceiver has a main antenna connection port (Main Port). The switch is coupled to the wireless transceiver, the first antenna, and the second antenna for selecting one from the first antenna and the second antenna to be electrically connected to the main antenna connection port of the wireless transceiver according to the sensing result.

In one or more embodiments of the present invention, the wireless transceiver further has an auxiliary antenna connection port (AUX Port), and the switch is further for pairing and electrically connecting the first antenna and the second antenna with the main antenna connection port and the auxiliary antenna connection port of the wireless transceiver according to the sensing result.

In one or more embodiments of the present invention, the wireless communication apparatus further includes a first high frequency cutoff filter and a second high frequency cutoff filter. The first high frequency cutoff filter is electrically connected between the feed terminal of the first antenna and the sensor. The second high frequency cutoff filter is electrically connected between the feed terminal of the second antenna and the sensor.

In one or more embodiments of the present invention, the wireless communication apparatus further includes a first feed low frequency cutoff filter and a second feed low frequency cutoff filter. The first feed low frequency cutoff filter is electrically connected between the feed terminal of the first antenna and the switch. The second feed low frequency cutoff filter is electrically connected between the feed terminal of the second antenna and the switch.

In one or more embodiments of the present invention, the wireless communication apparatus further includes a first ground low frequency cutoff filter and a second ground low frequency cutoff filter. The first ground low frequency cutoff filter is electrically connected between the ground terminal of the first antenna and a ground potential. The second ground low frequency cutoff filter is electrically connected between the ground terminal of the second antenna and the ground potential.

Another aspect of the present invention is to provide a wireless communication method using the above-mentioned wireless communication apparatus.

According to one embodiment of the present invention, a wireless communication method includes the following steps (The following steps are not recited in the sequence in which the steps are performed. That is, unless the sequence of the steps is expressly indicated, the sequence of the steps is interchangeable, and all or part of the steps may be simultaneously, partially simultaneously, or sequentially performed):

(1) sensing whether an object is close to at least one of a first antenna and a second antenna; and (2) selecting one of the first antenna and the second antenna which is away from the object to transmit data when the object is close to one of the first antenna and the second antenna.

In one or more embodiments of the present invention, covered areas of the first antenna and the second antenna covered by the object are calculated when the object is simultaneously close to both of the first antenna and the second antenna. One of the first antenna and the second antenna whose covered area is smallest is selected to transmit data.

In one or more embodiments of the present invention, the step (2) further includes:

(2.1) selecting one of the first antenna and the second antenna which is away from the object to be electrically connected to a main antenna connection port of a wireless transceiver.

The above-mentioned embodiments of the present invention have the following advantages when compared with the known prior art.

(1) The above-mentioned embodiments of the present invention directly use the first antenna and the second antenna as the sensing electrodes of the sensor. Therefore, the efficiencies of the first antenna and the second antenna are prevented from being affected by the sensing electrodes of the sensor.

(2) In the above-mentioned embodiments of the present invention, data transmission is switched to one of the first antenna and the second antenna which is away from a human body when the human body touches the first antenna and/or the second antenna. Therefore, the human, body can be prevented from absorbing too much non-ionizing radiation, and the communication quality can be maintained or even enhanced as well.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
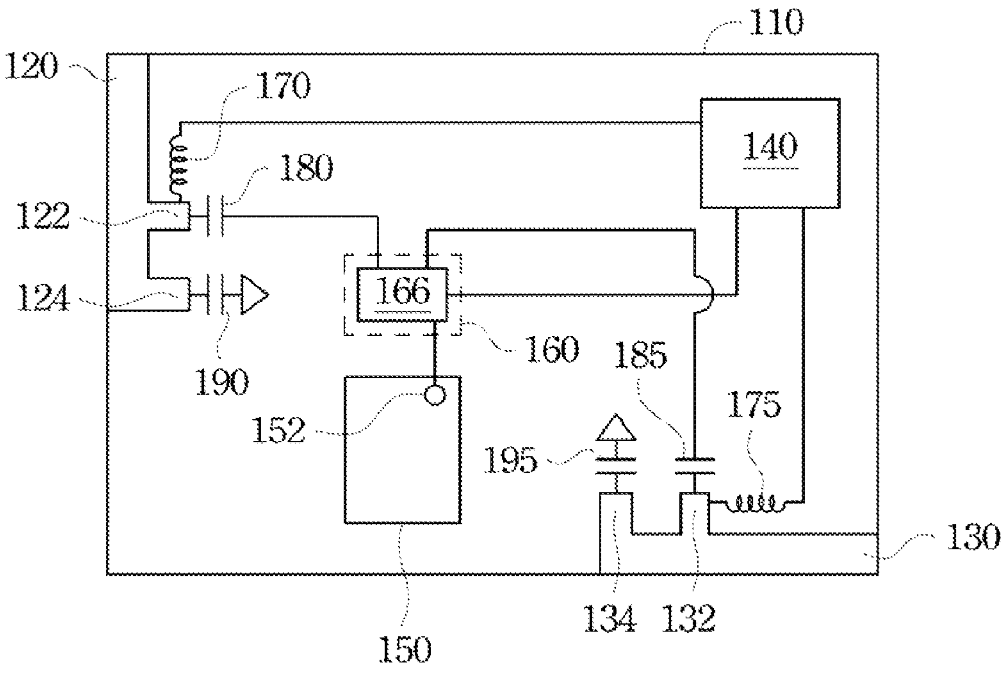
FIG. 1 is a functional block diagram of a wireless communication apparatus according to one embodiment of the present invention.

FIG. 1 is a functional block diagram of a wireless communication apparatus according to one embodiment of the present invention. The wireless communication apparatus includes a body 110, a first antenna 120, a second antenna 130, a sensor 140, a wireless transceiver 150, and a switch 160. Both of the first antenna 120 and the second antenna 130 are disposed in or on the body 110. The sensor 140 is electrically connected to the first antenna 120 and the second antenna 130 for sensing whether an object (e.g. a human body) is close to at least one of the first antenna 120 and the second antenna 130 to provide a sensing result. The wireless transceiver 150 has a main antenna connection port (Main Port) 152. The switch 160 is coupled to the wireless transceiver 150, the first antenna 120, and the second antenna 130 for selecting one from the first antenna 120 and the second antenna 130 to be electrically connected to the main antenna connection port 152 of the wireless transceiver 150 according to the sensing result.

For example, the switch 160 selects the second antenna 130 to be electrically connected to the main antenna connection port 152 of the wireless transceiver 150 when the human body (e.g. a palm or a head) is close to the first antenna 120 in use. On the other hand, the switch 160 selects the first antenna 120 to be electrically connected to the main antenna connection port 152 of the wireless transceiver 150 when the human body is close to the second antenna 130 in use.

That is to say, the above-mentioned embodiment of the present invention can automatically switch data transmission to one of the first antenna 120 and the second antenna 130 which is away from the human body when the human body touches the first antenna 120 or the second antenna 130. Therefore, the human body can be prevented from absorbing too much non-ionizing radiation, and the communication quality can be maintained or even enhanced as well.

In the above-mentioned embodiment of the present invention, the first antenna 120 and the second antenna 130 do not only function as antennas but also function as the sensing electrodes of the sensor 140. Specifically, the feed terminal 122 of the first antenna 120 and the feed terminal 132 of the second antenna 130 are both electrically connected to the sensing electrode connection ports of the sensor 140. Therefore, the first antenna 120 and the second antenna 130 can be directly used as the sensing electrodes of the sensor 140, and additional sensing electrodes respectively disposed near the first antenna 120 and the second antenna 130 are not necessary.

In use, the sensor 140 applies a small voltage to the first antenna 120 and the second antenna 130, resulting in a uniform electrostatic field. When the human body is placed over the first antenna 120 and/or the second antenna 130, a capacitor is dynamically formed, resulting in a touch-induced current. Accordingly, the sensor 140 can sense whether the human body touches the first antenna 120 and the second antenna 130 based on the touch-induced current.

In practice, the sensor 140 may be a proximity sensor, a body sensor, a capacitance sensor, or combinations thereof. It is to be noted that the sensors described herein are for illustrative purpose only, and the scope of this invention is not limited to the illustrated sensors. Any person having ordinary skill in the art may select a proper sensor to practice this embodiment without undue experimentation.

Since the frequency of the touch-induced current is much lower than the frequency of the radio communication signal, filters may be used in the present embodiment to prevent the radio communication signal from being shunted into the sensor 140. Specifically, the wireless communication apparatus of this embodiment may further include a first high frequency cutoff filter 170 and a second high frequency cutoff filter 175. The first high frequency cutoff filter 170 is electrically connected between the feed terminal 122 of the first antenna 120 and the sensor 140. The second high frequency cutoff filter 175 is electrically connected between the feed terminal 132 of the second antenna 130 and the sensor 140.

In practice, the first high frequency cutoff filter 170 and the second high frequency cutoff filter 175 may be inductors, coils, chokes, or combinations thereof. It is to be noted that the high frequency cutoff filters described herein are for illustrative purpose only, and the scope of this invention is not limited to the illustrated high frequency cutoff filters. Any person having ordinary skill in the art may select proper high frequency cutoff filters to practice this embodiment without undue experimentation.

Furthermore, in order to prevent the touch-induced current from being shunted into the wireless transceiver 150, the wireless communication apparatus of this embodiment may further include a first feed low frequency cutoff filter 180 and a second feed low frequency cutoff filter 185. The first feed low frequency cutoff filter 180 is electrically connected between the feed terminal 122 of the first antenna 120 and the switch 160. The second feed low frequency cutoff filter 185 is electrically connected between the feed terminal 132 of the second antenna 130 and the switch 160.

In the case that the first antenna 120 and the second antenna 130 have ground terminals 124/134 respectively, the wireless communication apparatus may further include a first ground low frequency cutoff filter 190 and a second ground low frequency cutoff filter 195. The first ground low frequency cutoff filter 190 is electrically connected between the ground terminal 124 of the first antenna 120 and a ground potential. The second ground low frequency cutoff filter 195 is electrically connected between the ground terminal 134 of the second antenna 130 and the ground potential.

In practice, the first feed low frequency cutoff filter 180, the second feed low frequency cutoff filter 185, the first ground low frequency cutoff filter 190 and the second ground low frequency cutoff filter 195 may be capacitors. It is to be noted that the low frequency cutoff filters described herein are for illustrative purpose only, and the scope of this invention is not limited to the illustrated low frequency cutoff filters. Any person having ordinary skill in the art may select proper low frequency cutoff filters to practice this embodiment without undue experimentation.

The design described in the aforementioned embodiment of the present invention can not only be applied to a one transmitter and one receiver system (i.e. the wireless transceiver 150 only has the main antenna connection port 152, and both the data transmitting function and the data receiving function are provided by the main antenna connection port 152) but is also suitable for a one transmitter and two receiver system. For example, the wireless transceiver 150 of FIG. 2 further has an auxiliary antenna connection port (AUX Port) 154 in addition to the main antenna connection port 152. The main antenna connection port 152 can provide both the data transmitting function and the data receiving function. The auxiliary antenna connection port 154 can only provide the data receiving function.

Figure 2:
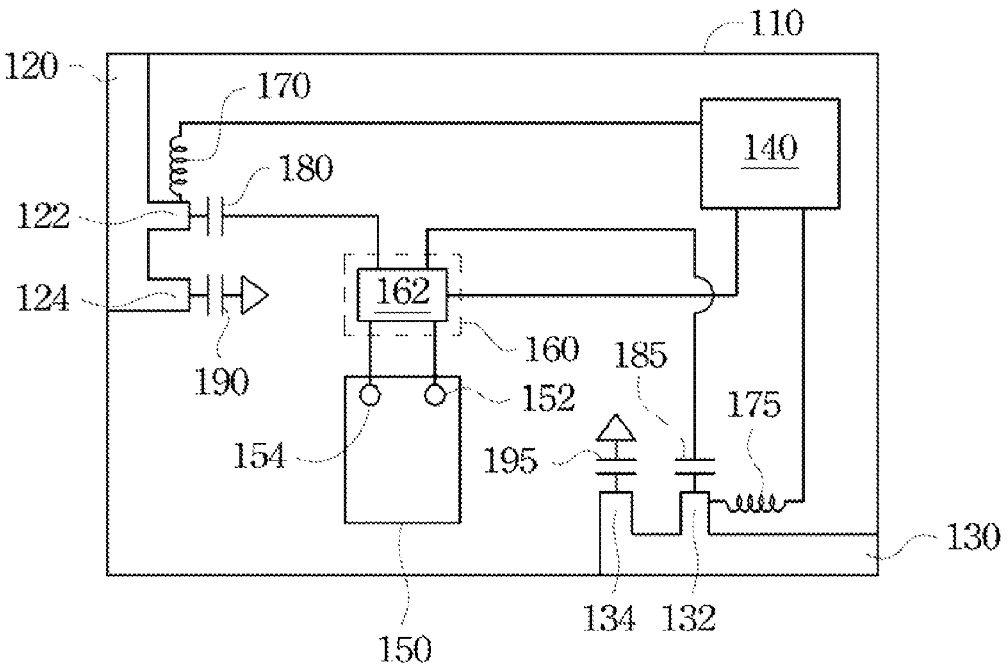
FIG. 2 is a functional block diagram of a wireless communication apparatus according to another embodiment of the present invention.

In FIG. 2, the switch 160 is further for pairing and electrically connecting the first antenna 120 and the second antenna 130 with the main antenna connection port 152 and the auxiliary antenna connection port 154 of the wireless transceiver 150 according to the sensing result. Specifically, since the main antenna connection port 152 provides the data transmitting function, which has a strong impact on the human body, the switch 160 switches the main antenna connection port 152 to an antenna which is away from the human body. On the other hand, since the auxiliary antenna connection port 154 only provides the data receiving function, which has a small impact on the human body, the switch 160 switches the auxiliary antenna connection port 154 to an antenna which is close to the human body.

For example, when the first antenna 120 is close to the human body (e.g. a palm or a head), the switch 160 electrically connects the main antenna connection port 152 of the wireless transceiver 150 to the second antenna 130 and electrically connects the auxiliary antenna connection port 154 of the wireless transceiver 150 to the first antenna 120. On the other hand, when the second antenna 130 is close to the human body, the switch 160 electrically connects the main antenna connection port 152 of the wireless transceiver 150 to the first antenna 120 and electrically connects the auxiliary antenna connection port 154 of the wireless transceiver 150 to the second antenna 130.

Figure 3:
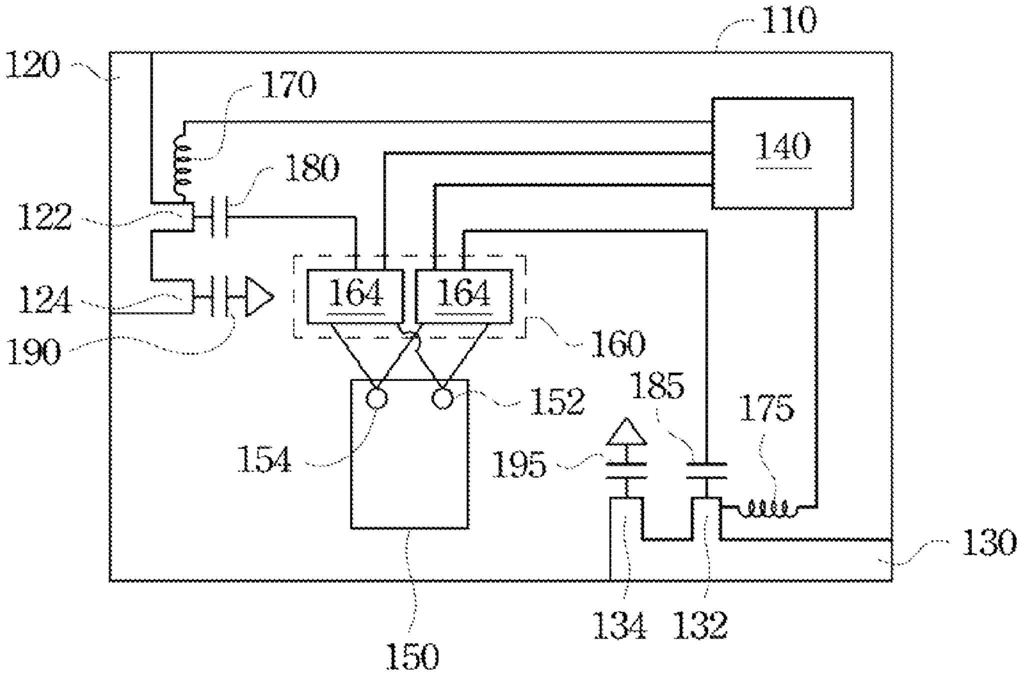
FIG. 3 is a functional block diagram of a wireless communication apparatus according to yet another embodiment of the present invention.
Figure 4:
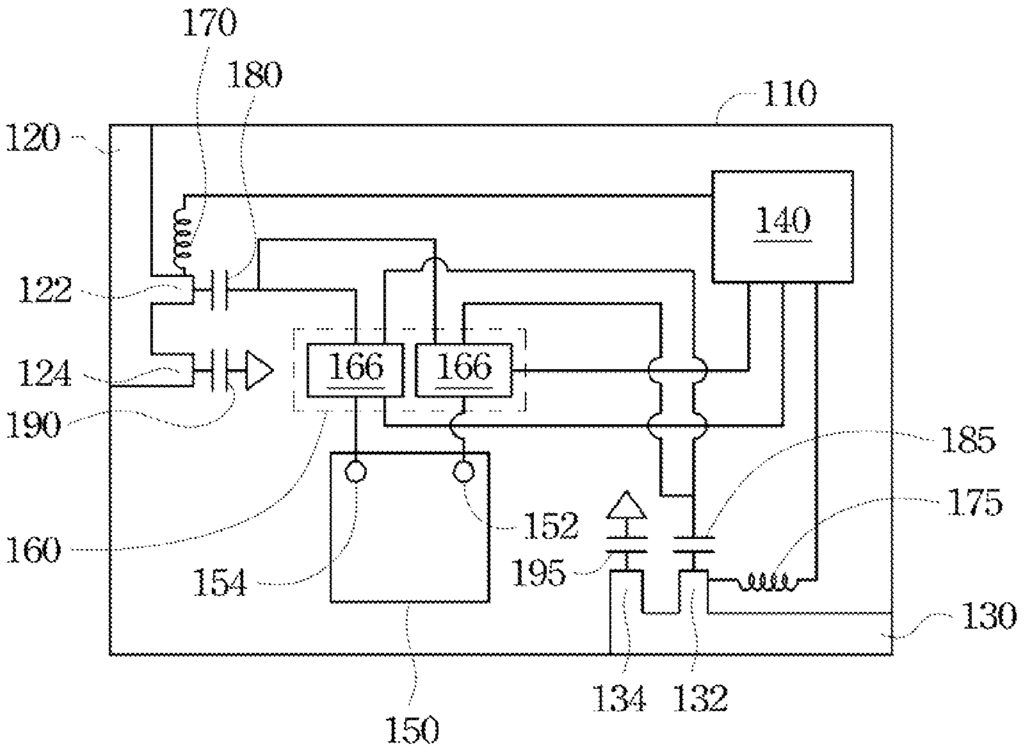
FIG. 4 is a functional block diagram of a wireless communication apparatus according to still another embodiment of the present invention.
Figure 5:
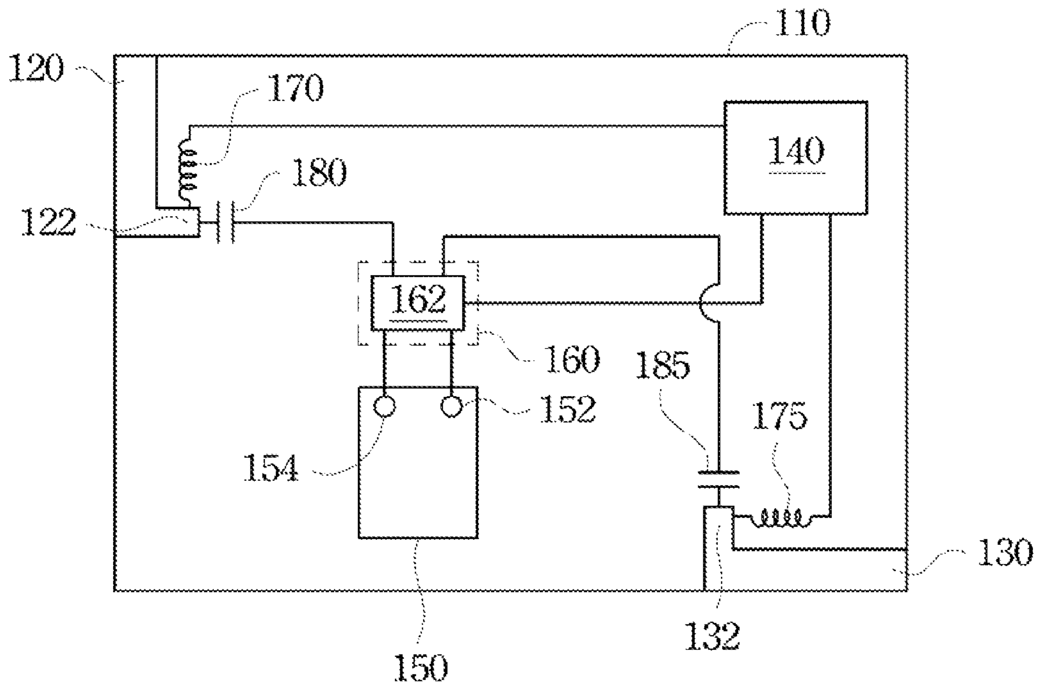
FIG. 5 is a functional block diagram of a wireless communication apparatus according to yet another embodiment of the present invention.
Figure 6:
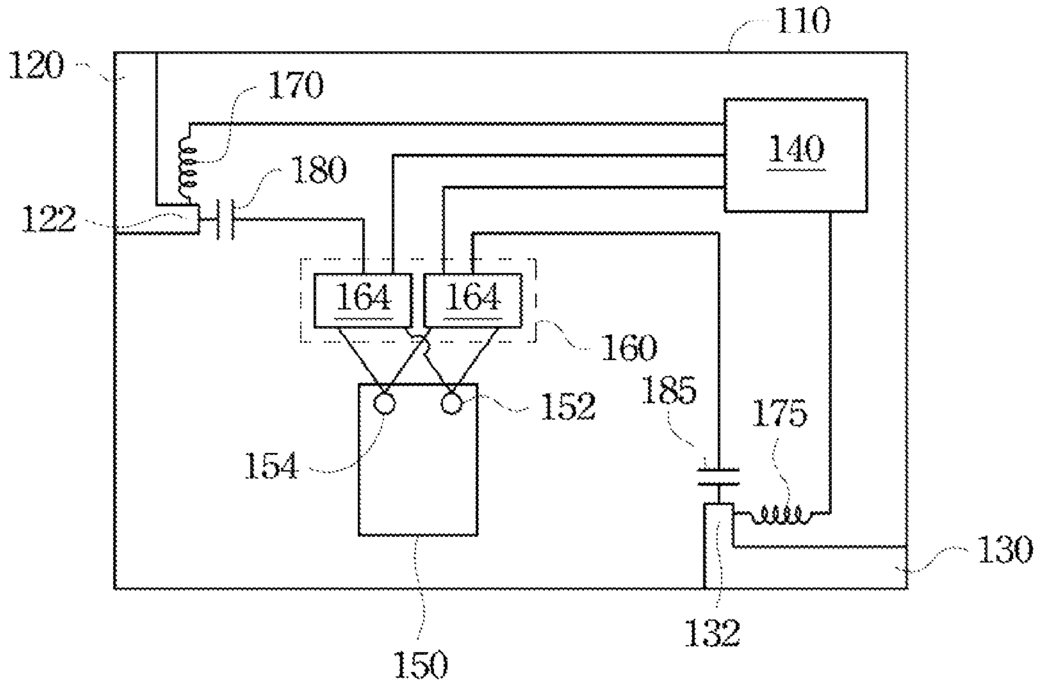
FIG. 6 is a functional block diagram of a wireless communication apparatus according to still another embodiment of the present invention.
Figure 7:
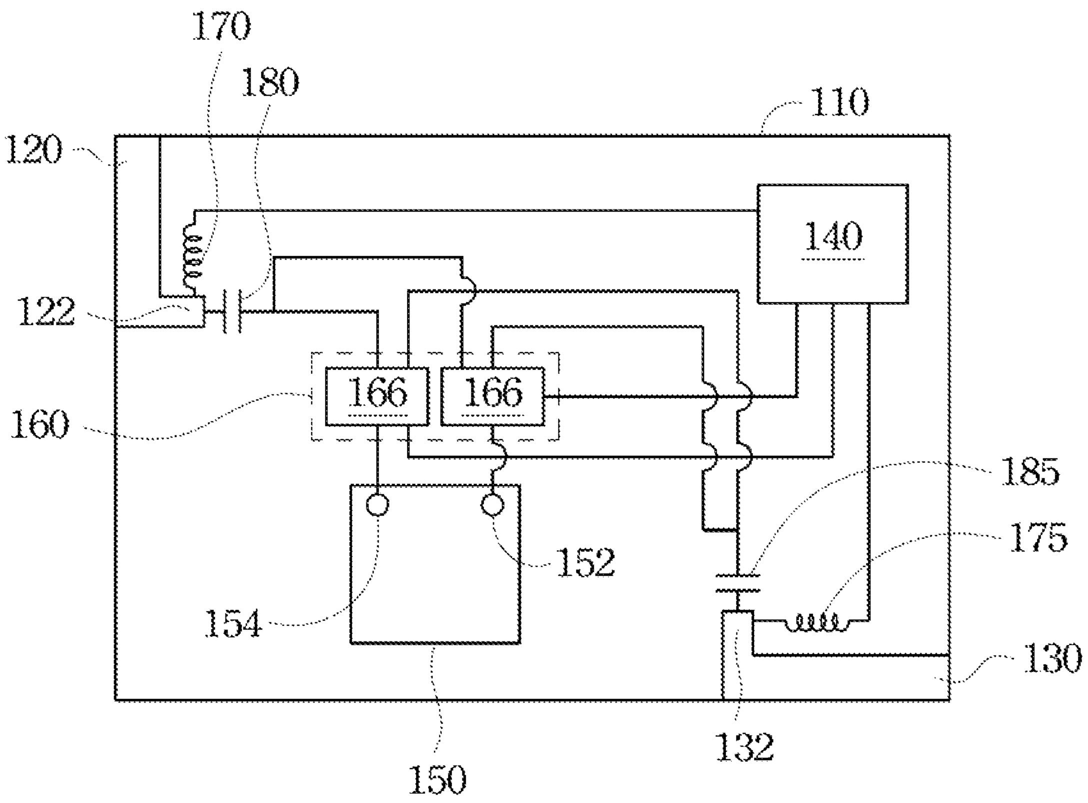
FIG. 7 is a functional block diagram of a wireless communication apparatus according to yet another embodiment of the present invention.

In practice, the switch 160 may be any type of switch or switch combination. For example, in FIGS. 2 and 5, the switch 160 is a single 2×2 switch 162. Alternatively, the switch 160 may be a pair of 1×2 switches 164 (as shown in FIGS. 3 and 6) or a pair of 2×1 switches 166 (as shown in FIGS. 4 and 7). Specifically, the 2×2 switch 162 may include a double pole double throw (DPDT) switch, and the 1×2 switches 164 and the 2×1 switches 166 may each include a single pole double throw (SPDT) switch.

The first antenna 120 and the second antenna 130 may be ground antennas, for example inverted F antennas (IFA), dipole antennas, etc., or no ground antennas, for example monopole antennas, helix antennas, etc. In the case that the first antenna 120 and the second antenna 130 are ground antennas (as shown in FIGS. 1-4), the wireless communication apparatus may includes the first ground low frequency cutoff filter 190 and the second ground low frequency cutoff filter 195 electrically connected to the ground terminal 124 of the first antenna 120 and the ground terminal 134 of the second antenna 130 respectively. In the case that the first antenna 120 and the second antenna 130 are no ground antennas (as shown in FIGS. 5-7), the first ground low frequency cutoff filter 190 and the second ground low frequency cutoff filter 195 are not necessary and can be omitted.

In addition, the first antenna 120 and the second antenna 130 may be disposed at two opposite corners of the body 110 to reduce the chance that the human body touches both the first antenna 120 and the second antenna 130 simultaneously. Certainly, if manufacturers have other prior concerns, for example communication quality, the first antenna 120 and the second antenna 130 may be disposed at other locations of the body 110 as well.

The body 110 can be any kind of wireless communication apparatus body including, but not limited to, a mobile phone, a smart phone, a notebook, a tablet personal computer, an electronic book, a personal digital assistant (PDA), an electronic dictionary, a global positioning system (GPS) navigation device, etc.

Another aspect of the present invention is to provide a wireless communication method using the above-mentioned wireless communication apparatus.

Figure 8:
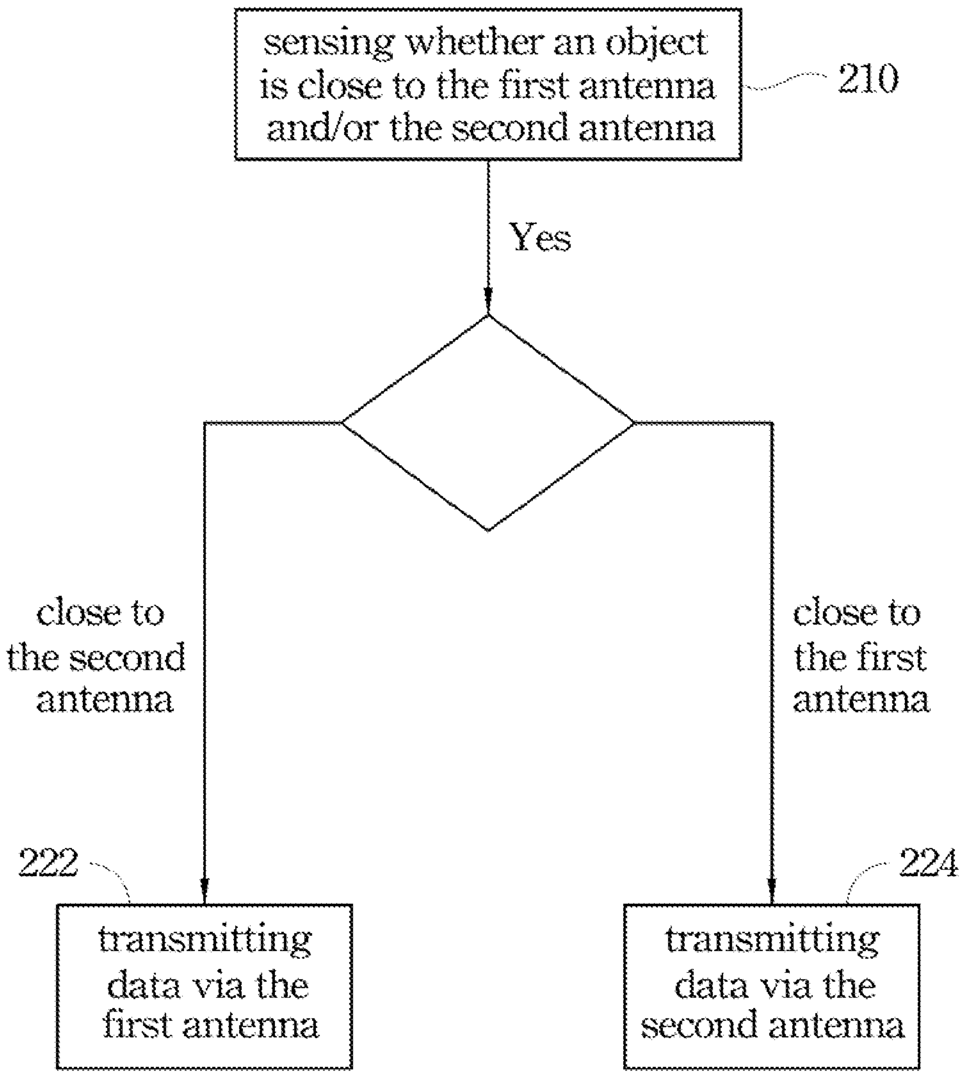
FIG. 8 is a flowchart of a wireless communication method according to one embodiment of the present invention.

FIG. 8 is a flowchart of a wireless communication method according to one embodiment of the present invention. As shown in FIG. 8, a wireless communication method includes the following steps (The following steps are not recited in the sequence in which the steps are performed. That is, unless the sequence of the steps is expressly indicated, the sequence of the steps is interchangeable, and all or part of the steps may be simultaneously, partially simultaneously, or sequentially performed):

(1) sensing whether an object is close to at least one of the first antenna 120 and the second antenna 130 (step 210); and (2) selecting one of the first antenna 120 and the second antenna 130 which is away from the object to transmit data when the object is close to one of the first antenna 120 and the second antenna 130.

For example, the wireless communication method of this embodiment selects the second antenna 130 to transmit data when the human body (e.g. a palm or a head) is close to the first antenna 120 in use (step 224). On the other hand, the wireless communication method of this embodiment selects the first antenna 120 to transmit data when the human body is close to the second antenna 130.

In practice, regardless of the kind of the wireless transceiver 150, e.g. a one transmitter and one receiver system (as shown in FIG. 1) or a one transmitter and two receiver system (as shown in FIGS. 2-7), since the main antenna connection port 152 provides the data transmitting function, the step (2) selects one of the first antenna 120 and the second antenna 130 which is away from the human body to be electrically connected to the main antenna connection port 152. In addition, in the case that the wireless transceiver 150 is a one transmitter and two receiver system (as shown in FIGS. 2-7), the wireless communication method of this embodiment selects one of the first antenna 120 and the second antenna 130 which is close to the human body to be electrically connected to the auxiliary antenna connection port 154.

Figure 9:
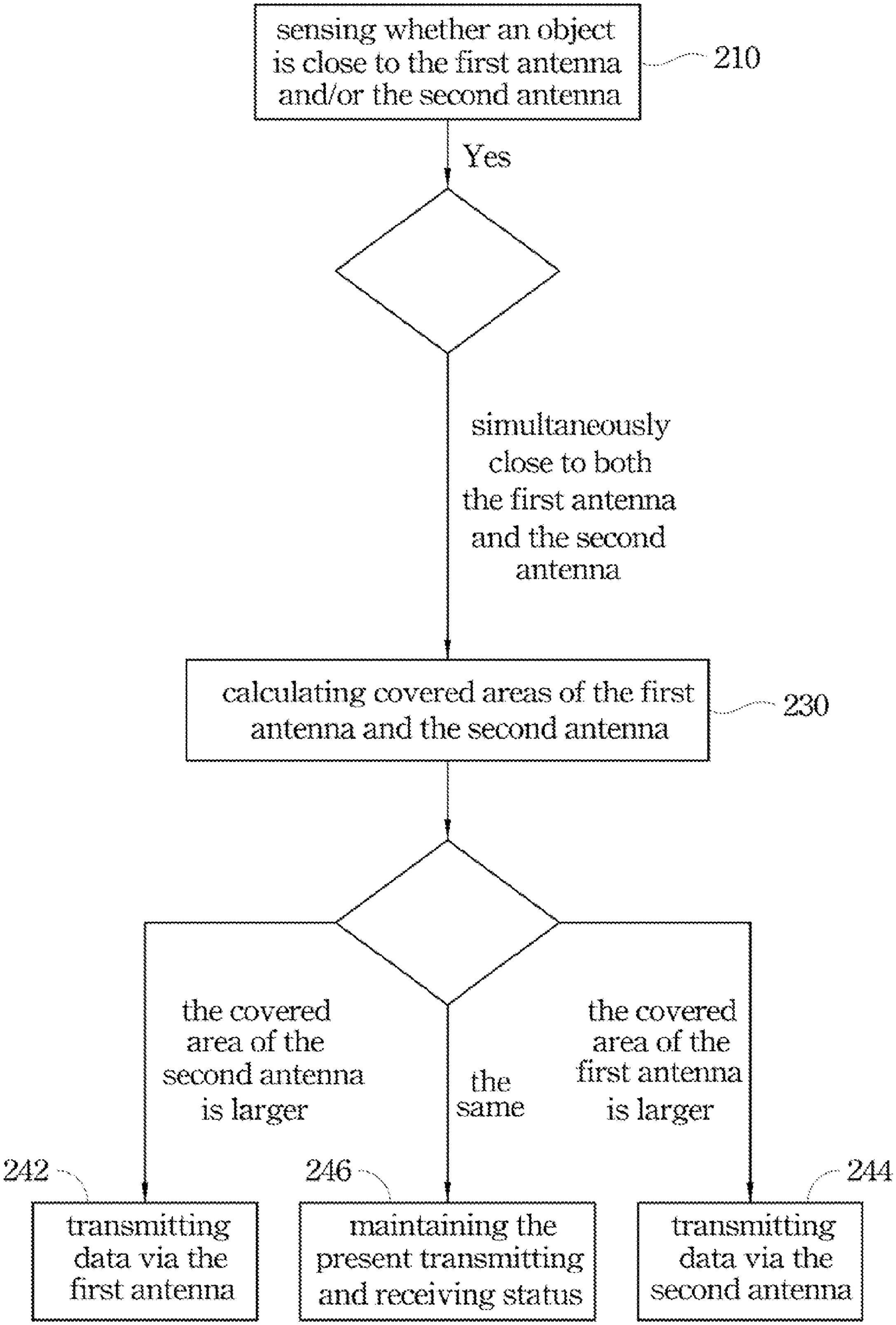
FIG. 9 is a flowchart of a wireless communication method according to another embodiment of the present invention.

FIG. 9 is a flowchart of a wireless communication method according to another embodiment of the present invention. In the present embodiment, when the object is simultaneously close to both of the first antenna 120 and the second antenna 130, the wireless communication method calculates covered areas of the first antenna 120 and the second antenna 130 covered by the object (step 230), and then one of the first antenna 120 and the second antenna 130 whose covered area is smallest is selected to transmit data.

For example, when the covered area of the first antenna 120 covered by the object is larger, the wireless communication method of this embodiment selects the second antenna 130 to transmit data (step 244). On the other hand, when the covered area of the second antenna 130 covered by the object is larger, the wireless communication method of this embodiment selects the first antenna 120 to transmit data (step 242).

Furthermore, when the covered areas of the first antenna 120 and the second antenna 130 covered by the object are the same, the wireless communication method of this embodiment maintains the present transmitting and receiving status of the first antenna 120 and the second antenna 130 (step 246). That is, if the wireless transceiver 150 transmits data via the first antenna 120, the wireless transceiver 150 is maintained to transmit data via the first antenna 120, and vice versa.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A wireless communication apparatus comprising:

a body;

a first antenna disposed in or on the body;

a second antenna disposed in or on the body;

a sensor electrically connected to the first antenna and the second antenna for sensing whether an object is close to at least one of the first antenna and the second antenna to provide a sensing result;

a wireless transceiver having a main antenna connection port;

a switch coupled to the wireless transceiver, the first antenna, and the second antenna for selecting one from the first antenna and the second antenna to be electrically connected to the main antenna connection port of the wireless transceiver according to the sensing results;

a first high frequency cutoff filter electrically connected between a feed terminal of the first antenna and the sensor; and a second high frequency cutoff filter electrically connected between a feed terminal of the second antenna and the sensor.

2. The wireless communication apparatus of claim 1, wherein the wireless transceiver further has an auxiliary antenna connection port, and the switch is further for pairing and electrically connecting the first antenna and the second antenna with the main antenna connection port and the auxiliary antenna connection port of the wireless transceiver according to the sensing result.

3. The wireless communication apparatus of claim 1, further comprising:

a first feed low frequency cutoff filter electrically connected between the feed terminal of the first antenna and the switch; and a second feed low frequency cutoff filter electrically connected between the feed terminal of the second antenna and the switch.

4. The wireless communication apparatus of claim 3, wherein the wireless transceiver further has an auxiliary antenna connection port, and the switch is further for pairing and electrically connecting the first antenna and the second antenna with the main antenna connection port and the auxiliary antenna connection port of the wireless transceiver according to the sensing result.

5. The wireless communication apparatus of claim 1, further comprising:

a first ground low frequency cutoff filter electrically connected between a ground terminal of the first antenna and a ground potential; and a second ground low frequency cutoff filter electrically connected between a ground terminal of the second antenna and the ground potential.

6. The wireless communication apparatus of claim 5, wherein the wireless transceiver further has an auxiliary antenna connection port, and the switch is further for pairing and electrically connecting the first antenna and the second antenna with the main antenna connection port and the auxiliary antenna connection port of the wireless transceiver according to the sensing result.

7. The wireless communication apparatus of claim 6, further comprising:

a first feed low frequency cutoff filter electrically connected between the feed terminal of the first antenna and the switch; and a second feed low frequency cutoff filter electrically connected between the feed terminal of the second antenna and the switch.

8. The wireless communication apparatus of claim 5, further comprising:

a first feed low frequency cutoff filter electrically connected between the feed terminal of the first antenna and the switch; and a second feed low frequency cutoff filter electrically connected between the feed terminal of the second antenna and the switch.

* * * * *